US008854874B2

(12) United States Patent
Takashima et al.

(10) Patent No.: US 8,854,874 B2
(45) Date of Patent: Oct. 7, 2014

(54) NONVOLATILE SEMICONDUCTOR MEMORY DEVICE INCLUDING VARIABLE RESISTANCE ELEMENT

(71) Applicant: Kabushiki Kaisha Toshiba, Minato-ku (JP)

(72) Inventors: Akira Takashima, Fuchu (JP); Hidenori Miyagawa, Yokohama (JP); Shosuke Fujii, Fujisawa (JP); Daisuke Matsushita, Fujisawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 13/966,985

(22) Filed: Aug. 14, 2013

(65) Prior Publication Data

US 2013/0329485 A1    Dec. 12, 2013

Related U.S. Application Data

(63) Continuation of application No. PCT/JP2012/058042, filed on Mar. 21, 2012.

(30) Foreign Application Priority Data

Jun. 16, 2011    (JP) .................. 2011-134325

(51) Int. Cl.
*G11C 13/00*    (2006.01)

(52) U.S. Cl.
CPC ........ *G11C 13/0002* (2013.01); *G11C 13/0069* (2013.01); *G11C 2213/33* (2013.01); *G11C 2213/77* (2013.01); *G11C 2013/0088* (2013.01); *G11C 2013/0073* (2013.01); *G11C 13/0011* (2013.01)
USPC .............. 365/163; 365/46; 365/100; 365/148

(58) Field of Classification Search
CPC ........... G11C 13/0004; G11C 13/0069; G11C 11/5678; G11C 2213/79; G11C 13/004
USPC .................... 365/163, 46, 100, 148
See application file for complete search history.

(56) References Cited

U.S. PATENT DOCUMENTS

| 7,957,203 B2 | 6/2011 | Nagashima et al. |
| 8,059,448 B2 | 11/2011 | Tanigami et al. |

(Continued)

FOREIGN PATENT DOCUMENTS

| JP | 2010-9662 | 1/2010 |
| WO | 2010/042732 | 4/2010 |

OTHER PUBLICATIONS

International Search Report issued on May 1, 2012 for PCT/JP2012/058042 filed on Mar. 21, 2012 in English.

(Continued)

*Primary Examiner* — Jason Lappas
(74) *Attorney, Agent, or Firm* — Oblon, Spivak, McClelland, Maier & Neustadt, L.L.P.

(57) ABSTRACT

According to one embodiment, a nonvolatile semiconductor memory device includes a memory cell array and a control circuit. The memory cell array include the memory cells each including a variable resistance element in which a reset current flowing in a reset operation is smaller than a set current flowing in a set operation by not less than one order of magnitude. The control circuit performs the reset operation and the set operation for the memory cells. The control circuit performs the reset operation for all memory cells being in the low resistance state and connected to selected first interconnections and selected second interconnections.

19 Claims, 9 Drawing Sheets

(56) References Cited

U.S. PATENT DOCUMENTS

| | | |
|---|---|---|
| 8,068,358 B2 | 11/2011 | Maejima |
| 8,331,137 B2 | 12/2012 | Takashima et al. |
| 8,355,275 B2 | 1/2013 | Ichihara et al. |
| 2009/0135637 A1* | 5/2009 | Takase ............................ 365/51 |
| 2009/0161408 A1 | 6/2009 | Tanigami et al. |
| 2010/0054017 A1 | 3/2010 | Maejima |
| 2010/0085798 A1 | 4/2010 | Lu et al. |

OTHER PUBLICATIONS

International Written Opinion issued on May 1, 2012 for PCT/JP2012/058042 filed on Mar. 21, 2012 in English.

International Preliminary Report on Patentability issued Jan. 3, 2014 in PCT/JP2012/058042 filed on Mar. 21, 2012.

Written Opinion issued May 1, 2012 in PCT/JP2012/058042 filed on Mar. 21, 2012.

\* cited by examiner

High resistance state  Low resistance state

NONVOLATILE SEMICONDUCTOR MEMORY DEVICE INCLUDING VARIABLE RESISTANCE ELEMENT

CROSS REFERENCE TO RELATED APPLICATIONS

This application is a Continuation Application of PCT Application No. PCT/JP2012/058042, filed Mar. 21, 2012 and based upon and claiming the benefit of priority from Japanese Patent Application No. 2011-134325, filed Jun. 16, 2011, the entire contents of all of which are incorporated herein by reference.

FIELD

Embodiments described herein relate generally to a nonvolatile semiconductor memory device using a variable resistance element that stores a resistance value as data.

BACKGROUND

The memory cell array of a cross-point type resistance change memory, which is one of nonvolatile semiconductor memory devices, is formed by arranging, at the intersections of bit lines and word lines, memory cells each including a variable resistance element and a selector connected in series with the variable resistance element. The variable resistance element can be set to a desired resistance value by controlling the voltage value and the application time. The selector is a rectifying element for preventing disturbance on the peripheral circuits. Both the variable resistance element and the selector are simple 2-terminal elements and can easily be stacked. For this reason, forming a three-dimensional structure of stacked variable resistance elements and selectors makes it possible to implement cost reduction and capacity increase of the resistance change memory.

One of the challenges to commercialization of the cross-point type resistance change memory is to optimize the set current and the reset current of the variable resistance element. An operation of making the variable resistance element transit from a high resistance state to a low resistance state will be referred to as set, and the current and voltage at the time of set will be referred to as a set current and a set voltage, respectively. An operation of making the variable resistance element transit from a low resistance state to a high resistance state will be referred to as reset, and the current and voltage at the time of reset will be referred to as a reset current and a reset voltage, respectively.

If the set current and the reset current are excessive, a large potential difference may be generated across the memory cell array due to voltage drop caused by the micropatterned wiring resistance. To suppress the voltage drop caused by the wiring resistance, the currents need to be reduced. However, if the set current and the reset current are reduced so as to be equal to or lower than the level of thermal noise or noise of circuit components of the semiconductor chip, current detection in the peripheral circuit elements is difficult. That is, the set current and the reset current of the variable resistance element have practical upper and lower limits. It is therefore necessary to make the set current and the reset current fall within the range that satisfies the conditions.

In an actual memory operation, an enormous quantity of data needs to be stored at a high speed. This requires a batch operation of a plurality of memory cells. When the batch operation of memory cells on one interconnection, that is, a so-called page operation is performed, all currents of the plurality of memory cells concentrate to the interconnection. To suppress the voltage drop caused by the interconnection, the set current and the reset current are preferably as small as possible. However, as described above, the set current and the reset current have lower limits. Hence, the number of memory cells of the batch operation is limited. For this reason, the data storage speed decreases.

DETAILED DESCRIPTION

A nonvolatile semiconductor memory device according to the embodiment will now be described with reference to the accompanying drawing. Note that the same reference numerals denote constituent elements having the same functions and arrangements in the following description, and a repetitive description will be made only when necessary.

In general, according to one embodiment, a nonvolatile semiconductor memory device includes a memory cell array and a control circuit. The memory cell array includes memory cells connected between first interconnections and second interconnections. Each of the memory cells includes a variable resistance element in which a reset current flowing in a reset operation is smaller than a set current flowing in a set operation by not less than one order of magnitude. The reset operation is an operation of causing the memory cell to transit from a low resistance state to a high resistance state by applying a reset voltage between the first interconnection and the second interconnection. The set operation is an operation of causing the memory cell to transit from the high resistance state to the low resistance state by applying a set voltage having a polarity different from the reset voltage between the first interconnection and the second interconnection. The control circuit performs the reset operation and the set operation for the memory cells. The control circuit performs the reset operation for all memory cells being in the low resistance state and connected to selected first interconnections and selected second interconnections.

[First Embodiment]
[1] Arrangement of Nonvolatile Semiconductor Memory Device

Figure 1:
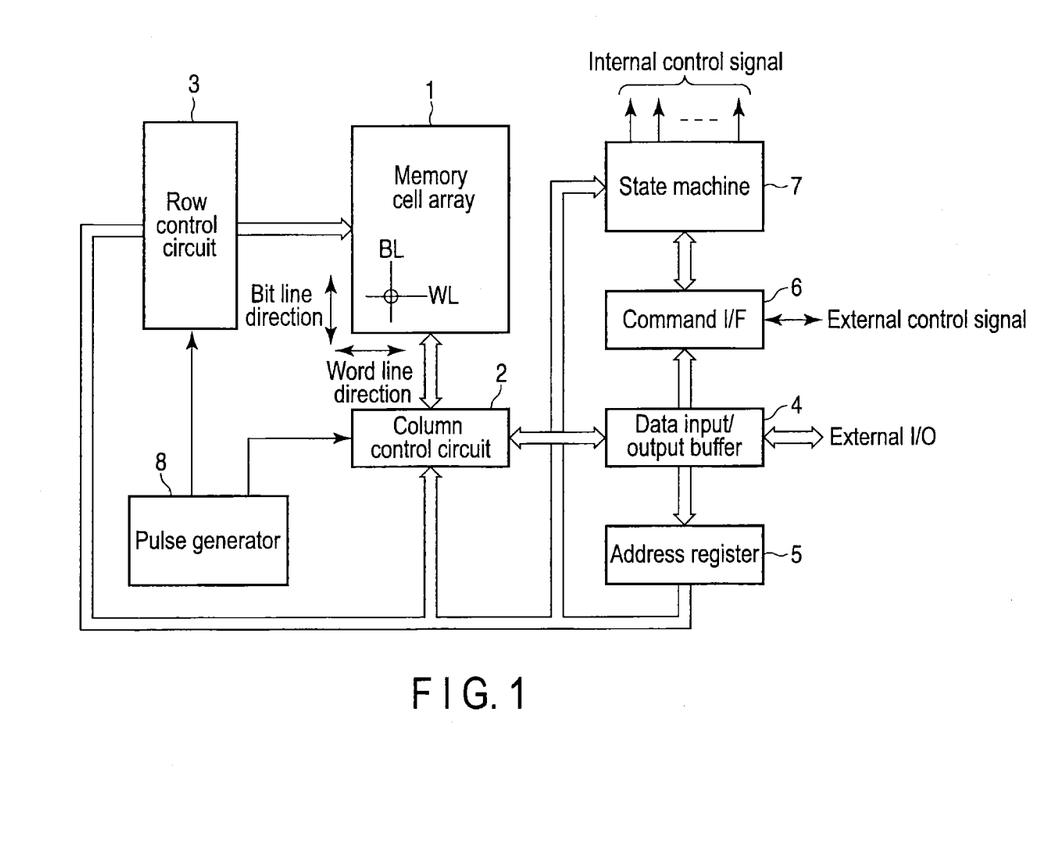
FIG. 1 is a block diagram of a nonvolatile semiconductor memory device according to a first embodiment.

FIG. 1 is a block diagram of a nonvolatile semiconductor memory device according to the first embodiment.

This nonvolatile semiconductor memory device comprises a memory cell array 1 in which the memory cells of a resistance change memory using variable resistance elements are arranged in a matrix. A column control circuit 2 is provided at an adjacent position in the direction of bit lines BL of the memory cell array 1. The column control circuit 2 is part of a control circuit, and controls the bit lines BL in the memory cell array 1 to perform data erase of the memory cells, data write to the memory cells, and data read from the memory cells. A row control circuit 3 is provided at an adjacent position in the direction of word lines WL of the memory cell array 1. The row control circuit 3 is part of the control circuit, and selects the word line WL in the memory cell array 1 and applies voltages necessary for data erase of the memory cells, data write to the memory cells, and data read from the memory cells.

A data input/output buffer 4 is connected to an external host device (not shown) via an I/O line and receives write data, receives an erase instruction, outputs readout data, and receives address data and command data. The data input/output buffer 4 sends received write data to the column control circuit 2. The data input/output buffer 4 also receives, from the column control circuit 2, data read out from the memory cell array 1 and externally outputs it.

An address externally supplied to the data input/output buffer 4 is sent to the column control circuit 2 and the row control circuit 3 via an address register 5. A command supplied from the host device to the data input/output buffer 4 is sent to a command interface (command I/F) 6. The command interface 6 receives an external control signal from the host device and determines what the data input to the data input/output buffer 4 is write data, a command, or an address. If the input data is a command, the command interface 6 receives the data and transfers it to a state machine 7 that is part of the control circuit as a command signal.

The state machine 7 manages the entire nonvolatile semiconductor memory device. The state machine 7 receives a command from the host device and manages data input/output such as read, write, and erase. The external host device can receive status information managed by the state machine 7 and determine the operation result. The status information is also used to control write and erase. The state machine 7 controls a pulse generator 8 that is part of the control circuit. This control allows the pulse generator 8 to output a pulse of an arbitrary voltage at an arbitrary timing.

More specifically, an externally supplied address is input to the state machine 7 via the address register 5. The state machine 7 determines the position of the access target memory cell in the memory cell array 1. The pulse generator 8 generates a pulse voltage to the memory cell. The generated pulse can be transferred to an arbitrary interconnection selected by the column control circuit 2 and the row control circuit 3.

Note that the peripheral circuit elements other than the memory cell array 1 can be formed on a silicon substrate immediately under the memory cell array 1. This enables to make the chip area of the semiconductor memory device almost equal to the area of the memory cell array 1.

Figure 2:
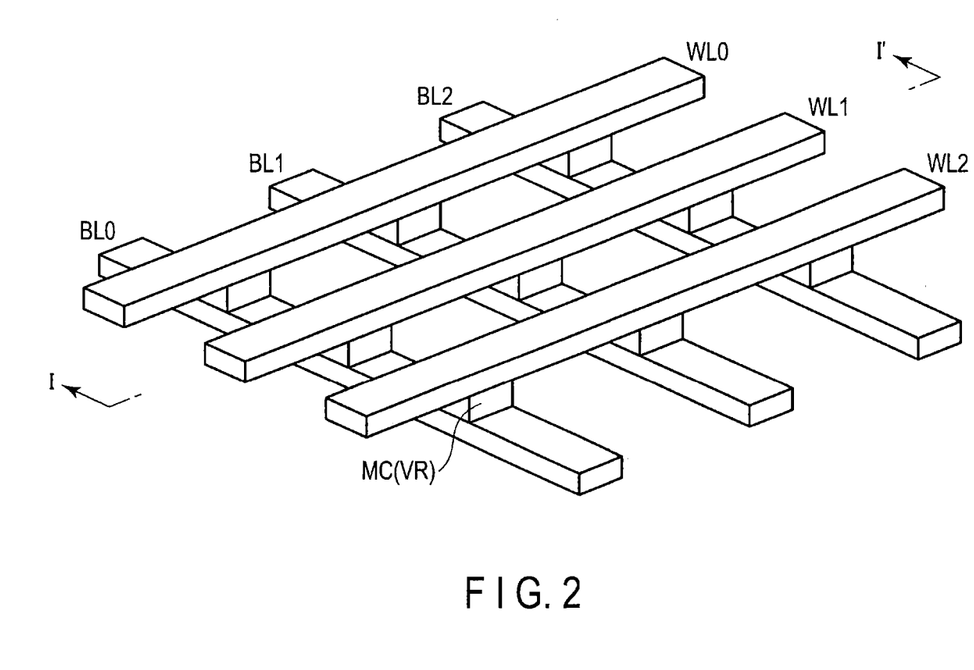
FIG. 2 is a perspective view of part of a memory cell array according to the first embodiment.
Figure 3A:
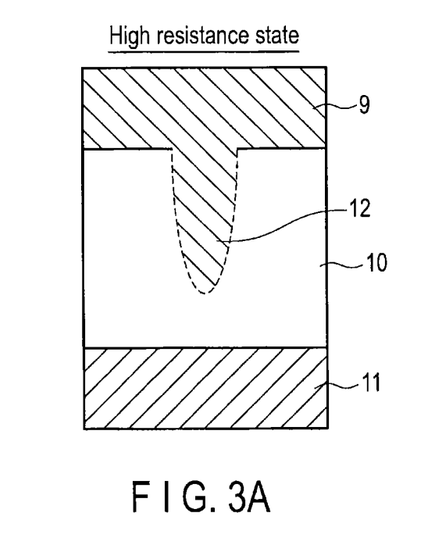
FIGS. 3A and 3B are sectional views of a memory cell according to the first embodiment.
Figure 3B:
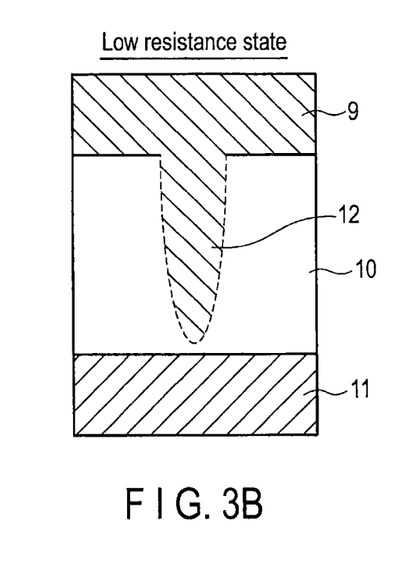

FIG. 2 is a perspective view of part of the memory cell array 1. FIGS. 3A and 3B are sectional views of a memory cell taken along a line I-I' in FIG. 2 and viewed from the direction of arrows.

As shown in FIG. 2, bit lines BL0 to BL2 are disposed parallel as a plurality of first interconnections. Word lines WL0 to WL2 are disposed parallel as a plurality of second interconnections that intersect the bit lines. Memory cells MC each including a variable resistance element VR are arranged at the intersections of the bit lines BL0 to BL2 and the word lines WL0 to WL2 so as to be sandwiched between the interconnections.

The bit lines BL and the word lines WL are preferably made of a heat-resistant material having a low resistance value. For example, W, WSi, Mo, MoSi, NiSi, CoSi, or a carbon material such as carbon nanotubes or graphene is usable.

As shown in FIGS. 3A and 3B, the variable resistance element VR comprises electrode layers 9 and 11, and a recording layer (resistance change layer) 10 arranged between the electrode layers 9 and 11. The electrode layer 9 contains at least one of metals such as Fe, Co, Ni, Cu, Ag, Au, Zn, and Al and silicides thereof. In this embodiment, for example, Ag is used in the electrode layer 9. The recording layer 10 contains one of, for example, amorphous silicon, polysilicon, and single-crystal silicon. In this embodiment, for example, amorphous silicon is used in the recording layer 10. The electrode layer 11 contains an n-type semiconductor containing P or As, for example, n-type Si, n-type SiGe, or n-type Ge. In this embodiment, for example, n-type Si is used in the electrode layer 11. Electrodes (not shown) functioning as a barrier metal and an adhesive layer are arranged on the upper and lower sides of the variable resistance element VR so as to sandwich the variable resistance element VR.

The initial state of the recording layer 10 is a high resistance state as shown in FIG. 3A. When a positive potential is applied to the electrode layer 9, and a fixed potential (0 V) is applied to the electrode layer 11, Ag ions contained in the electrode layer 9 are diffused into the recording layer 10 and move to the side of the electrode layer 11. A metal filament 12 as shown in FIG. 3B is thus formed in the recording layer 10. As a result, the variable resistance element VR changes to a low resistance state (set). In the low resistance state, the metal filament 12 need not be in contact with the electrode layer 11. The distal end of the metal filament 12 may be spaced apart from the electrode layer 11 so as to allow a tunnel current to flow.

In reset where transition from the low resistance state to the high resistance state occurs, a potential having a polarity opposite to that in the set is applied. More specifically, a negative potential is applied to the electrode layer 9, and a fixed potential (0 V) is applied to the electrode layer 11. An electric field whose polarity is opposite to that in the set is applied to the recording layer 10 to shorten the metal filament 12. The distance between the electrode layer 11 and the metal filament 12 increases, and the variable resistance element VR transits to the high resistance state (reset), as shown in FIG. 3A. N-type Si of the electrode layer 11 is depleted upon applying the negative potential to the electrode layer 9. Since the voltage applied to the variable resistance element VR is distributed to the depletion layer of the electrode layer (n-type Si) 11 and the recording layer 10, the voltage necessary for reset is large.

Figure 4:
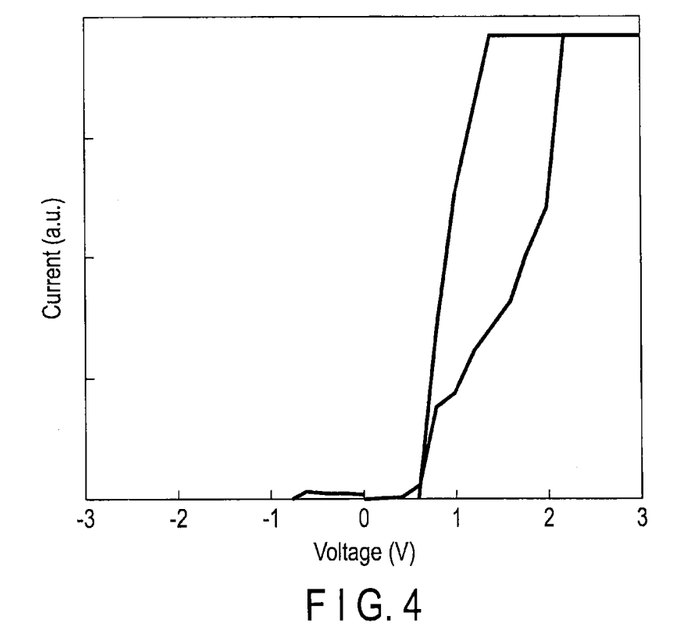
FIG. 4 is a graph showing the current-voltage characteristic of a variable resistance element according to the first embodiment.

FIG. 4 shows the current-voltage characteristic of the variable resistance element VR. This variable resistance element contains Ag in the electrode layer 9, amorphous silicon in the recording layer 10, and n-type Si in the electrode layer 11. Note that the ordinate adopts logarithmic notation.

As shown in FIG. 4, upon sweeping to a positive voltage, the current amount considerably increases and reaches the limiter current set at the time of measurement. Upon sweeping to a negative voltage, the current amount rarely increases, and a current variation ΔI/V per V is less than one order of magnitude. Consequently, the voltage in the reset operation is higher than that in the set operation by three or more orders of magnitude. The small reset current amount suggests that the reset operation depends on not the current but the voltage. When the memory cells having such an IV characteristic are used, reset can be done while suppressing the amounts of currents flowing to the variable resistance elements VR and the interconnections.

Examples of the metal used in the electrode layer 9 to form the metal filament 12 are Fe, Co, Ni, Cu, Au, Zn, and Al other than Ag, as described above. The recording layer 10 can also use HfOx, HfSiOx, MnOx, MnAlxOy, ZnMnOx, NiOx, TiOx, WOx, $SiO_2$, SiN, or Si that are transition metal compounds.

[2] Operation of Nonvolatile Semiconductor Memory Device

Figure 5:
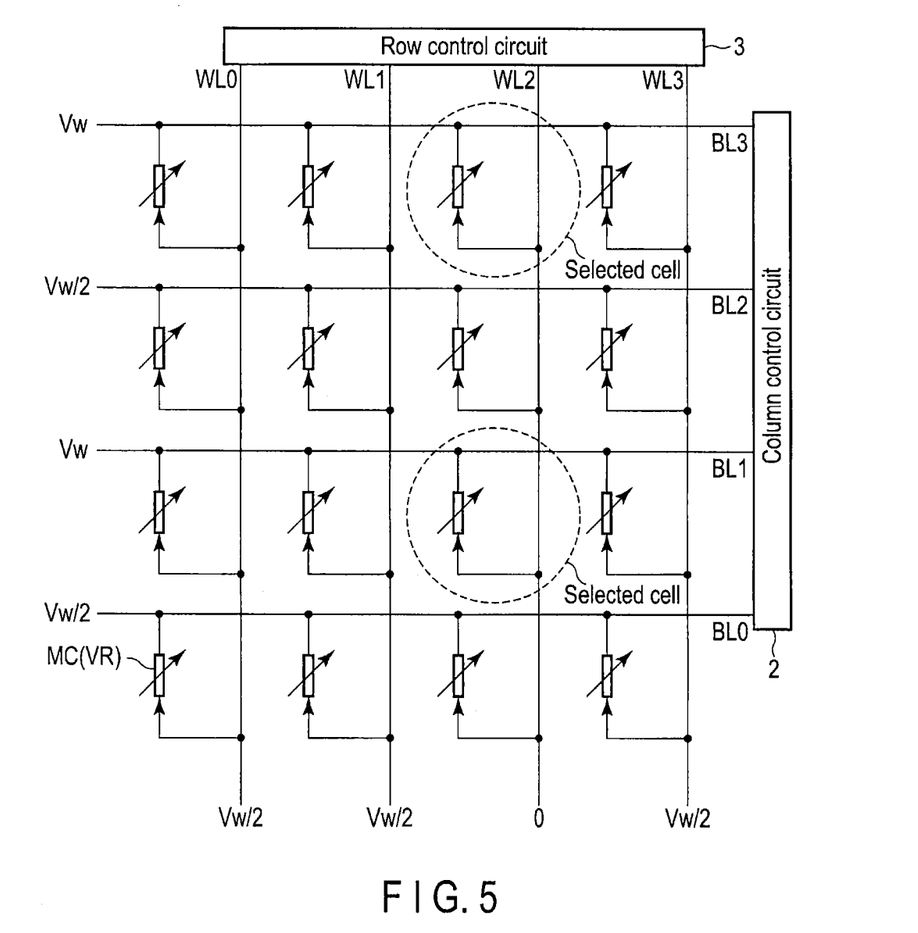
FIG. 5 is a view showing applied voltages in the reset operation of the memory cell array according to the first embodiment.

In the first embodiment, the reset operation that causes transition from the low resistance state to the high resistance state is defined as write, and the set operation that causes transition from the high resistance state to the low resistance state is defined as erase. The reset operation in the memory cell array 1 of the nonvolatile semiconductor memory device will be described with reference to FIG. 5. Note that FIG. 5 illustrates a case in which the memory cell array 1 is formed from one MAT. A MAT means a group of memory cells arranged in a matrix formed from word lines connected to one row control circuit and bit lines connected to one column control circuit.

FIG. 5 shows applied voltages in the reset operation of the memory cell array.

More specifically, the reset operation of the variable resistance elements VR arranged at the intersections of the selected word line WL2 and the selected bit lines BL1 and BL3 will be explained.

All variable resistance elements VR in the memory cell array 1 are set in advance. That is, the variable resistance elements VR are set in the low resistance state. The method of setting the variable resistance elements VR will be described later.

First, the selected word line WL2 is set to the fixed potential (0 V). A reset voltage Vw is applied to the selected bit lines BL1 and BL3. A voltage Vw/2 is applied to the unselected bit lines BL0 and BL2 and the unselected word lines WL0, WL1, and WL3. As for the reset voltage Vw, when the electrode layer 9 is set to the fixed potential (0 V) in the variable resistance element shown in FIGS. 3A and 3B, the voltage applied to the electrode layer 11 is the positive voltage Vw.

The negative reset voltage Vw is applied to the variable resistance elements VR arranged at the intersections of the selected bit lines BL1 and BL3 and the selected word line WL2. A voltage of 0 V is applied to the variable resistance elements VR arranged at the intersections of the unselected bit lines BL0 and BL2 and the unselected word lines WL0, WL1, and WL3. That is, no voltage is applied.

The negative voltage Vw/2 is applied to the variable resistance elements VR arranged at the intersections of the selected bit lines BL1 and BL3 and the unselected word lines WL0, WL1, and WL3 to form a so-called half-selected state. The negative voltage Vw/2 is applied to the variable resistance elements VR arranged at the intersections of the unselected bit lines BL0 and BL2 and the selected word line WL2 as well to form the half-selected state. With this half-select operation, a voltage of the same polarity or 0 V is applied to all variable resistance elements VR regardless of the selected or unselected state.

The voltage of the same polarity corresponds to the negative voltage direction of the graph shown in FIG. 4. It is therefore possible to suppress the amounts of currents flowing to all variable resistance elements and interconnections. For example, assume that the reset current flowing to the variable resistance elements VR upon applying the reset voltage Vw is 10 pA, and the current flowing to the unselected cells is 1 pA. In this case, the amount of the current flowing to the selected word line WL2 is suppressed to 22 pA in the memory cell array 1 shown in FIG. 5. This low current operation solves the problem of the so-called sneak current that is problematic in a conventional variable resistance element. The sneak current means the leakage current flowing to the selected bit lines through the unselected memory cells.

When the variable resistance element VR having the current-voltage characteristic shown in FIG. 4 is used, no selector need be added. This allows to implement a simple memory cell structure and reduce the manufacturing cost.

Examine verify in the variable resistance element VR. When performing verify using a reset voltage, as in a conventional device, the verify itself is difficult because the current amount is too small. In this embodiment, verify is performed by applying a voltage having a polarity opposite to that of the reset voltage, that is, a voltage having the same polarity as that of the set voltage. This enables to do verify of the variable resistance element in which resistance value read is conventionally difficult because current detection is difficult due to noise.

A so-called page operation will be described next, which resets a plurality of variable resistance elements VR connected to one word line at once using the fact that the reset current of the variable resistance element VR is small. Assume that a sheet resistance Rs of the interconnection (word line) is 10 Ω/□, a thickness t of the interconnection is 10 nm, and a distance (inter-element distance) L between adjacent variable resistance elements is 20 nm. Let Idrop be the current flowing to one variable resistance element VR. Upon performing a batch operation of all of n (n=1, 2, ..., n) memory cells connected to one word line, a voltage drop Vdrop of the word line is given by $$V_{drop} = \sum_n k \times I_{drop} \times R_s \frac{L}{t} = \frac{n(n+1)I_{drop}R_sL}{2t} \quad (1)$$

For example, assume that the allowable value of the voltage drop is Vdrop=0.1 V. From equation (1), a page operation for n≥30000 bits is possible. That is, even when 30,000 cells are connected to one word line, the batch reset operation can be performed. When the time necessary for resetting the variable resistance elements VR is relatively long, for example, when the pulse width of the reset voltage is 3 μs, high-speed data storage at 10 Gbps can be done theoretically as the performance of the memory cell array. In addition, a MAT can have a larger size of, for example, about 30000×30000. Since the area of the row and column control circuits on one memory chip consequently decreases, the information amount per unit area of the chip can be increased.

Figure 6:
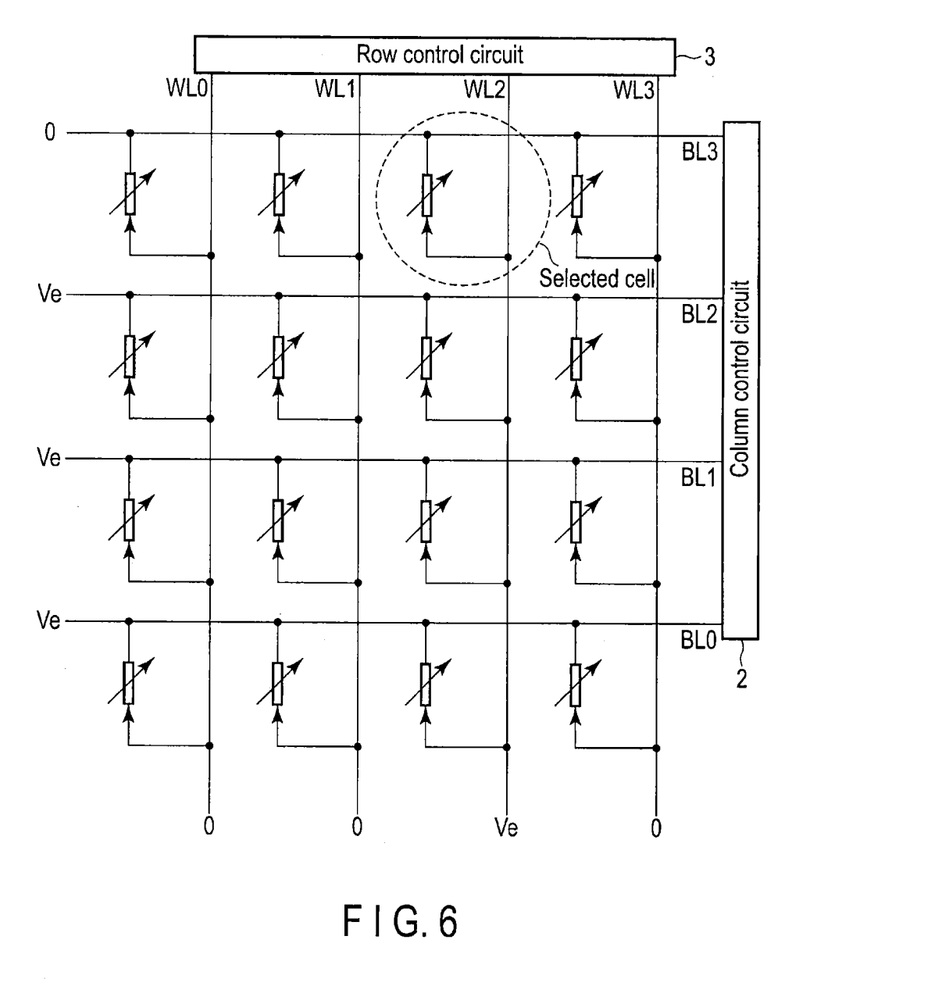
FIGS. 6 and 7 are views showing applied voltages in the set operation of the memory cell array according to the first embodiment.

The set operation (erase) in the memory cell array 1 will be described next with reference to FIG. 6. FIG. 6 shows applied voltages in the set operation of the memory cell array.

More specifically, the set operation of the variable resistance elements VR arranged at the intersections of the selected word line WL2 and the selected bit line BL3 will be explained.

The selected bit line BL3 and the unselected word lines WL0, WL1, and WL3 are set to the fixed potential (0 V). A set voltage Ve is applied to the selected word line WL2 and the unselected bit lines BL0, BL1, and BL2. In the variable resistance element VR shown in FIGS. 3A and 3B, the set voltage Ve corresponds to a case in which the electrode layer 11 is set to the fixed potential (0 V), and the electrode layer 9 is set to the positive potential Ve. That is, it corresponds to the positive voltage direction of the current-voltage characteristic shown in FIG. 4. The set voltage Ve is thus applied to the selected variable resistance element VR. However, −Ve is applied to the unselected variable resistance elements VR, or no voltage is applied to them at all.

When the element having the current-voltage characteristic shown in FIG. 4 is used, no voltage in the positive direction is applied to the unselected variable resistance elements. This allows to suppress the amount of the current flowing to the interconnection to which only the unselected variable resistance elements are connected. That is, the influence of the sneak current can be eliminated. However, when |reset voltage Vw|<|set voltage Ve|, and the time necessary for reset is shorter than that necessary for set, a reset error, that is, so-called disturbance may occur. For this reason, a variable resistance element for which the reset time is longer than the set time, or |reset voltage Vw|>|set voltage Ve| is preferable.

In the variable resistance element of this embodiment which has the current-voltage characteristic shown in FIG. 4, since the electrode layer (n-type Si) 11 is depleted, the voltage is distributed to the electrode layer 11. Hence, |reset voltage Vw|>|set voltage Ve| can be satisfied by, for example, making the electrode layer 11 sufficiently thick or reducing the dopant concentration in the electrode layer 11 (n-type Si).

Figure 7:
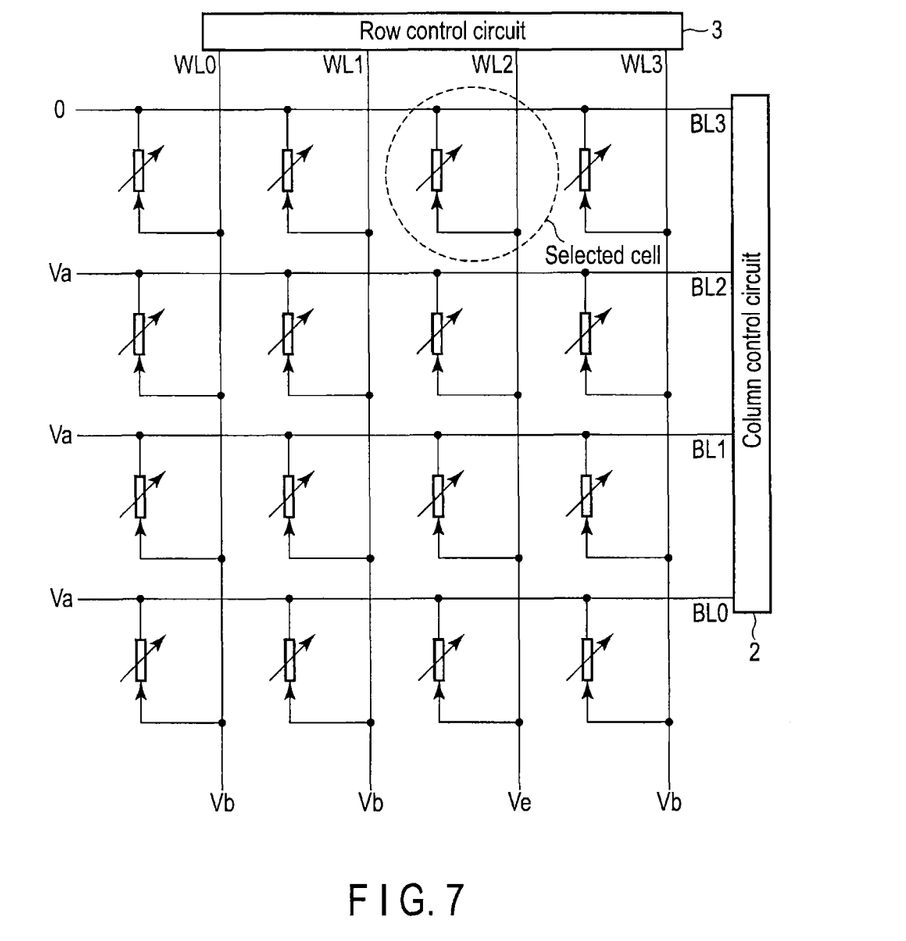

However, the disturbance at the time of set can be avoided even if the above condition is not satisfied. As shown in FIG. 7, the disturbance can also be avoided by applying a voltage Vb to the unselected word lines WL0, WL1, and WL3 and a voltage Va to the unselected bit lines BL0, BL1, and BL2. In this case, 0<Va<Ve/2 and Ve/2<Vb<Ve need to be satisfied. At this time, since the current amount of the selected word line WL2 or the selected bit line BL3 increases, a weak half-selected state in which the voltage Va is close to 0 V, and the voltage Vb is close to the set voltage Ve is preferable.

The set operation in a single cell has been described above because the set current is larger than the reset current. However, it is possible to perform the page operation of the set operation within the current amount range allowing the influence of voltage drop or interconnections.

When the memory cell array 1 includes a plurality of MATs (unit cell arrays), set formatting can effectively be done by performing the reset (write) operation of a first MAT, and during that time, performing set (erase) of a second MAT different from the first MAT under the reset. This method is particularly effective for a cell in which the reset time is longer than the set time. For example, in the memory cell shown in FIGS. 3A and 3B, the reset time is longer than the set time, and there is typically a difference of three or more orders of magnitude. Hence, the data storage speed can be increased by resetting the memory cells in the first MAT and simultaneously setting the memory cells in the second MAT. Note that the MAT is a cell array unit including a plurality of memory cells that can be write-accessed or erased, that is, reset or set at once. In general, when a MAT includes 1000× 1000 or more memory cells, the set current and the reset current need to have a current difference of $10^3$ or more to normally operate them.

Figure 8:
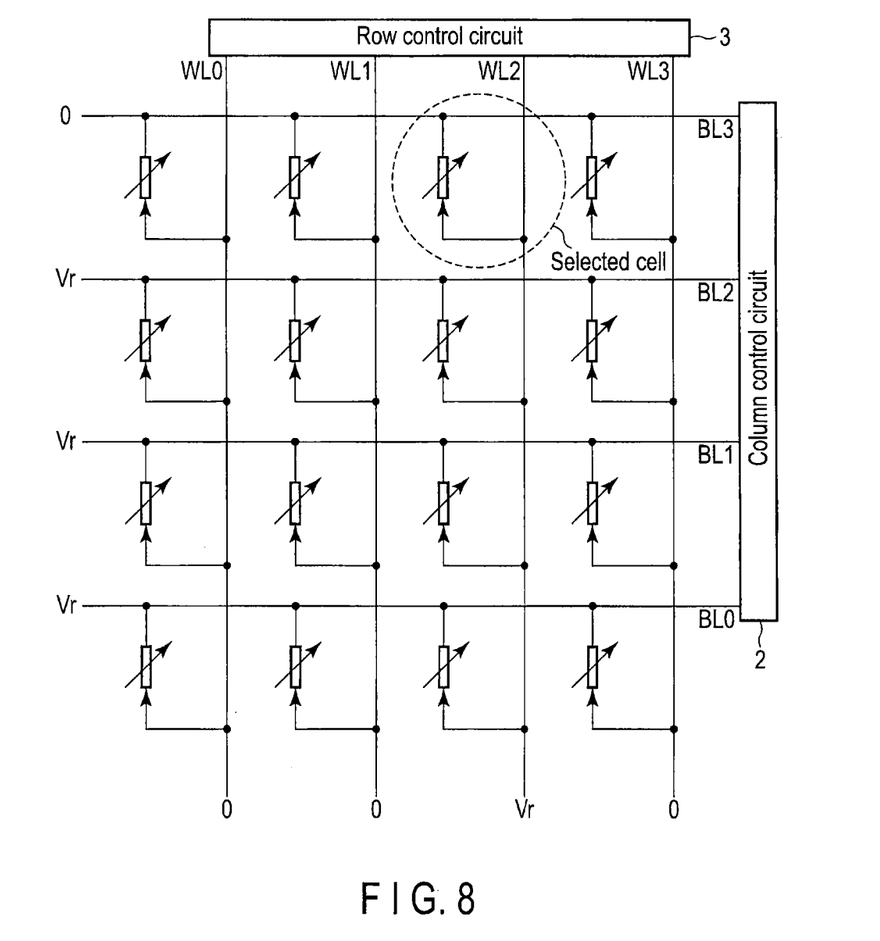
FIG. 8 is a view showing applied voltages in the read operation of the memory cell array according to the first embodiment.

Finally, the read operation in the memory cell array 1 will be described with reference to FIG. 8.

In the read operation, a read voltage Vr lower to the set voltage Ve is applied to a selected memory cell (variable resistance element VR) to read data from it. When the amount of the current that flows upon applying the read voltage Vr to the selected memory cell is 10 to 50 nA, memory cells of 1,000 bits can be read-accessed, and the read time can be about 50 ns. For this reason, the memory cell read performance guarantees high-speed read of an enormous number of bits. In the read operation as well, the operation of reducing the current amount using the weak half-select operation is possible, as in the above-described write operation.

[3] Effects of Nonvolatile Semiconductor Memory Device

In the conventional memory cells and data write method, the number of memory cells to be write-accessed at once is limited, and batch processing of an enormous quantity of data is difficult. In addition, a variable resistance element using a very small reset current is hard to practically use because read by the reset current is impossible.

Using a variable resistance element for which the reset current is smaller than the set current, the nonvolatile semiconductor memory device of this embodiment enables batch write in a plurality of memory cells by the reset operation. In addition, performing read by applying a voltage having a polarity opposite to that of the reset voltage allows practical use of the variable resistance element using a small reset current.

Furthermore, when a variable resistance element having the current-voltage characteristic shown in FIG. 4 is used, and the data write method of this embodiment is used, the conventionally required selector is unnecessary, and the deposition and work processes and the like of the selector material can be omitted. In this embodiment, the variable resistance elements are set in advance in the low resistance state, thereby improving the data storage speed.

According to this embodiment, it is possible to provide a nonvolatile semiconductor memory device capable of batch write of an enormous quantity of data without dividing the memory cell array into small pieces.

[Second Embodiment]

[1] Arrangement of Nonvolatile Semiconductor Memory Device

A nonvolatile semiconductor memory device according to the second embodiment will be described next. The nonvolatile semiconductor memory device according to the second embodiment has the same arrangement as in the first embodiment shown in FIGS. 1 to 4, and a repetitive description thereof will be omitted.

[2] Operation of Nonvolatile Semiconductor Memory Device

In the second embodiment, the reset operation that causes transition from the low resistance state to the high resistance state is defined as erase, and the set operation that causes transition from the high resistance state to the low resistance state is defined as write. In the reset operation, all memory cells in a MAT or a page are erased at once. The reset operation and the set operation are the same as in the first embodiment, although the reset operation and the set operation are defined as erase and write, respectively. The read operation is performed by applying a voltage having a polarity opposite to that of the reset voltage, as in the first embodiment.

Figure 9:
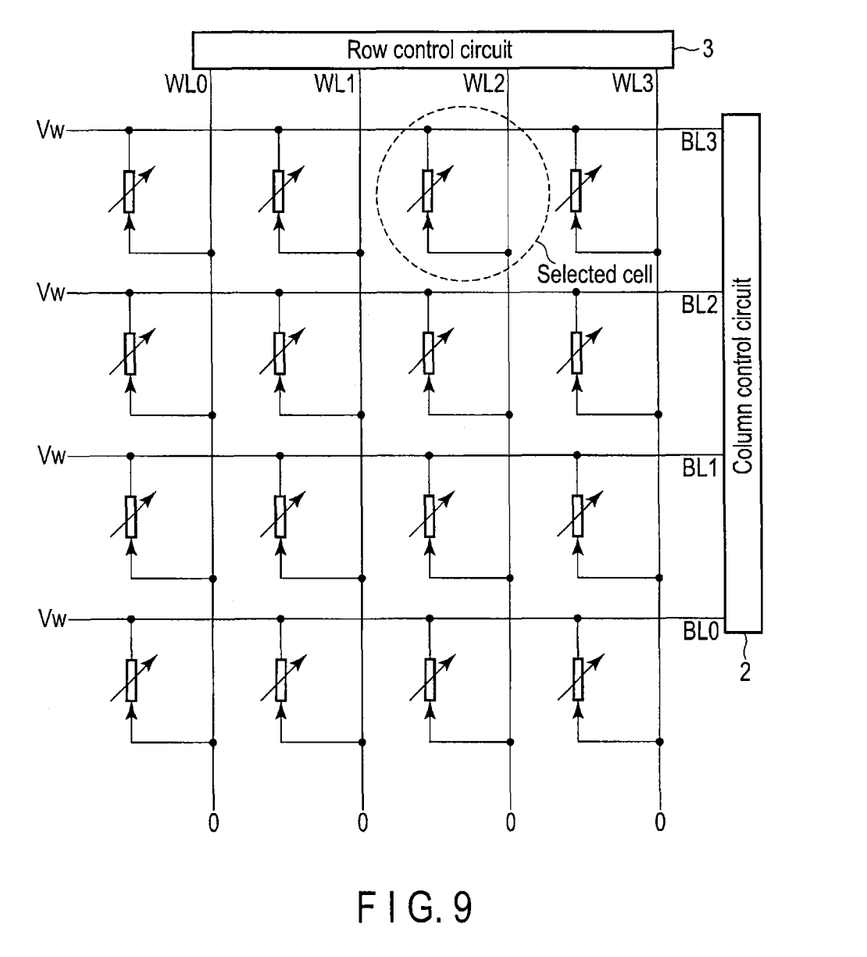
FIG. 9 is a view showing applied voltages in the erase operation of a memory cell array according to a second embodiment.

The erase operation (reset operation) in a memory cell array 1 of the nonvolatile semiconductor memory device will be described with reference to FIG. 9. As described in the first embodiment, the current that flows to a variable resistance element VR shown in FIG. 4 at the time of reset is very small. This allows to perform erase of a plurality of memory cells for each page or MAT. As for the operation, a fixed potential (0 V)

is applied to all word lines, and a voltage Vw is applied to all bit lines, as shown in FIG. 9, thereby resetting the memory cell array shown in FIG. 9.

According to this embodiment, it is possible to provide a nonvolatile semiconductor memory device capable of batch erase of an enormous quantity of data without dividing the memory cell array into small pieces.

[Other Embodiments]

The embodiments have been described above. However, the embodiments are not limited to those. For example, the variable resistance element VR may be of a metal crosslinking type, an interface resistance change type, or an oxidation-reduction type. The operation of the embodiment is possible as long as the current-voltage characteristic of the memory cell is asymmetric in the positive and negative voltage directions. A voltage driven variable resistance element is preferably used in which a current rarely flows upon application of the reset voltage. In addition, the set current need only fall within the range allowing the voltage drop of an interconnection in a single memory cell.

Conventionally known is a flash memory that is an inexpensive electrically rewritable nonvolatile bulk memory. The flash memory simultaneously implements cost reduction and capacity increase by micropatterning. However, further capacity increase is expected to be difficult because of the limitation of micropatterning. The nonvolatile semiconductor memory device of this embodiment can be used as a successor to the flash memory.

This embodiment is applicable not only to the cross-point type resistance change memory shown in FIG. 2 but also to another nonvolatile memory, for example, a nonvolatile memory using the BiCS (Bit Cost Scalable) technology.

The nonvolatile memory using the BiCS technology will briefly be described below.

Figure 10:
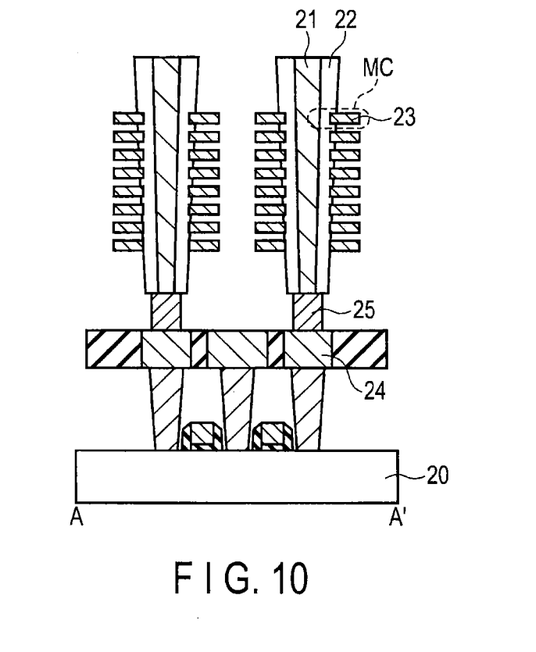
FIGS. 10 and 11 are views showing an example of a nonvolatile memory having a three-dimensional structure to which the embodiment is applied.
Figure 11:
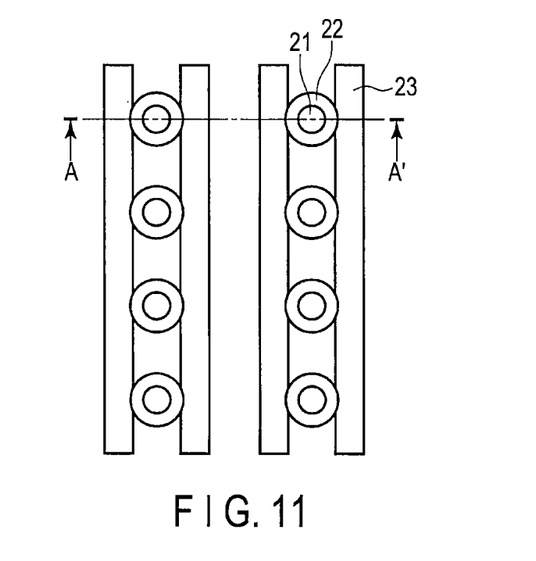

FIG. 11 is a view showing the nonvolatile memory using the BiCS technology from above. FIG. 10 is a sectional view taken along a line A-A' in FIG. 11.

As shown in FIGS. 10 and 11, vertical lines (first interconnections) 21 are formed vertically on a substrate 20. A material 22 that forms a variable resistance element is formed to surround each vertical line 21. A plurality of horizontal lines (second interconnections) 23 are arrayed in the vertical direction along the vertical lines 21. The horizontal lines 23 run in the horizontal direction on the substrate 20.

With this structure, a plurality of memory cells MC are formed by the vertical lines 21, the horizontal lines 23, and the variable resistance elements 22 between the vertical lines 21 and the horizontal lines 23. The plurality of memory cells MC are arranged in the vertical direction along the vertical lines 21. In addition, other interconnections 24, contact plugs 25, and the like are formed between the vertical lines 21 and the substrate 20.

In the nonvolatile memory having the above-described structure, since the memory cells MC each including the variable resistance element 22 can be stacked three-dimensionally, the integration degree and the capacity of the nonvolatile memory can be increased.

As described above, according to the embodiment, it is possible to provide a nonvolatile semiconductor memory device capable of storing an enormous quantity of data at once at a high speed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
    a memory cell array comprising memory cells connected between first interconnections and second interconnections without transistors connected between the first interconnections and the second interconnections, each of the memory cells including a variable resistance element in which a reset current flowing in a reset operation is smaller than a set current flowing in a set operation by not less than one order of magnitude, the reset operation being an operation of causing the memory cell to transit from a low resistance state to a high resistance state by applying a reset voltage between the first interconnection and the second interconnection, and the set operation being an operation of causing the memory cell to transit from the high resistance state to the low resistance state by applying a set voltage having a polarity different from the reset voltage between the first interconnection and the second interconnection; and
    a control circuit configured to perform the reset operation and the set operation for the memory cells, the control circuit performing the reset operation for all memory cells being in the low resistance state and connected to selected first interconnections and selected second interconnections.

2. The device according to claim 1, wherein in the reset operation, the control circuit sets unselected first interconnections and unselected second interconnections to an equipotential.

3. The device according to claim 1, wherein in the set operation, the control circuit makes an unselected second interconnection a potential not less than a potential of a selected first interconnection, makes an unselected first interconnection a potential not more than a potential of a selected second interconnection, and makes the unselected second interconnection a potential higher than the potential of the unselected first interconnection.

4. The device according to claim 1, wherein the control circuit configured to perform a verify operation or a read operation for the memory cells, by applying a verify voltage or a read voltage lower than the set voltage and having same polarity as the set voltage thereof.

5. The device according to claim 1, wherein an absolute value of the reset voltage is larger than an absolute value of the set voltage.

6. The device according to claim 1, wherein the variable resistance element comprises a first electrode layer, a second electrode layer, and a resistance change layer arranged between the first electrode layer and the second electrode layer, and
    the first electrode layer is electrically connected to the first interconnection, and the second electrode layer is electrically connected to the second interconnection.

7. The device according to claim 6, wherein the first electrode layer contains at least one of Fe, Co, Ni, Cu, Ag, Au, Zn, and Al and silicides thereof.

8. The device according to claim 7, wherein the second electrode layer contains at least one of n-type Si, n-type SiGe, and n-type Ge.

9. The device according to claim 1, wherein
the memory cell array includes a first cell array and a second cell array each including memory cells for which one of the reset operation and the set operation is executable at once, and
the control circuit performs the set operation for the memory cells in the second cell array during the reset operation performed for the memory cells in the first cell array.

10. The device according to claim 1, wherein
the memory cell array includes not less than $10^6$ memory cells for which one of the reset operation and the set operation is executable at once, and
a current difference between the set current and the reset current is not less than $10^3$.

11. A nonvolatile semiconductor memory device comprising:
a memory cell array comprising memory cells connected between first interconnections and second interconnections without transistors connected between the first interconnections and the second interconnections, each of the memory cells including a variable resistance element in which a reset current flowing in a reset operation is smaller than a set current flowing in a set operation by not less than one order of magnitude, the reset operation being an operation of causing the memory cell to transit from a low resistance state to a high resistance state, and the set operation being an operation of causing the memory cell to transit from the high resistance state to the low resistance state; and
a first control circuit and a second control circuit configured to perform the reset operation and the set operation for the memory cells, the first control circuit and the second control circuit performing the reset operation for all memory cells arranged in a matrix formed from the first interconnections connected to the first control circuit and the second interconnections connected to the second control circuit.

12. The device according to claim 11, wherein in the set operation, the first control circuit and the second control circuit make an unselected second interconnection a potential not less than a potential of a selected first interconnection, make an unselected first interconnection a potential not more than a potential of a selected second interconnection, and make the unselected second interconnection a potential higher than the potential of the unselected first interconnection.

13. The device according to claim 11, wherein configured to perform a verify operation or a read operation for the memory cells, by applying a verify voltage or a read voltage lower than a set voltage applied in the set operation and having same polarity as the set voltage thereof.

14. The device according to claim 11, wherein an absolute value of a reset voltage applied in the reset operation is larger than an absolute value of a set voltage applied in the set operation.

15. The device according to claim 11, wherein
the variable resistance element comprises a first electrode layer, a second electrode layer, and a resistance change layer arranged between the first electrode layer and the second electrode layer, and
the first electrode layer is electrically connected to the first interconnection, and the second electrode layer is electrically connected to the second interconnection.

16. The device according to claim 15, wherein the first electrode layer contains at least one of Fe, Co, Ni, Cu, Ag, Au, Zn, and Al and silicides thereof.

17. The device according to claim 16, wherein the second electrode layer contains at least one of n-type Si, n-type SiGe, and n-type Ge.

18. The device according to claim 11, wherein
the memory cell array includes a first cell array and a second cell array each including memory cells for which one of the reset operation and the set operation is executable at once, and
the first control circuit and the second control circuit perform the set operation for the memory cells in the second cell array during the reset operation performed for the memory cells in the first cell array.

19. The device according to claim 11, wherein
the memory cell array includes not less than $10^6$ memory cells for which one of the reset operation and the set operation is executable at once, and
a current difference between the set current and the reset current is not less than $10^3$.

* * * * *